(12) United States Patent
Rampon et al.

(10) Patent No.: US 7,146,589 B1
(45) Date of Patent: Dec. 5, 2006

(54) REDUCING EQUIVALENCE CHECKING COMPLEXITY USING INVERSE FUNCTION

(75) Inventors: Jerome Daniel Jean Rampon, Montpellier (FR); Kenneth S. McElvain, Menlo Park, CA (US)

(73) Assignee: Synplicity, Inc., Sunnyvale, CA (US)

( * ) Notice: Subject to any disclaimer, the term of this patent is extended or adjusted under 35 U.S.C. 154(b) by 221 days.

(21) Appl. No.: 10/924,433

(22) Filed: Aug. 23, 2004

(51) Int. Cl.
*G06F 17/50* (2006.01)

(52) U.S. Cl. .................... 716/5; 716/7; 716/2; 703/16

(58) Field of Classification Search .................. 716/5, 716/7, 2; 703/16
See application file for complete search history.

(56) References Cited

U.S. PATENT DOCUMENTS

| | | | |
|---|---|---|---|
| 6,086,626 A * | 7/2000 | Jain et al. ........................ | 716/5 |
| 6,212,669 B1 * | 4/2001 | Jain ................................. | 716/7 |
| 6,301,687 B1 * | 10/2001 | Jain et al. ........................ | 716/3 |
| 6,334,205 B1 * | 12/2001 | Iyer et al. ........................ | 716/7 |
| 6,530,063 B1 * | 3/2003 | Andreev et al. ................ | 716/7 |
| 6,560,758 B1 * | 5/2003 | Jain ................................. | 716/7 |
| 7,028,278 B1 * | 4/2006 | Jain ................................. | 716/5 |
| 2004/0015799 A1 * | 1/2004 | Jain ................................. | 716/5 |
| 2006/0129953 A1 * | 6/2006 | Jain ................................. | 716/3 |

OTHER PUBLICATIONS

Shi-Yu Huang, "Formal Equivalence Checking And Design Debugging", Kluwer Academic Publishers, 1998, pp. 1-229.

Daniel Brand, "Verification of Large Synthesized Designs", IEEE, 1993, pg. 534-537.

Wolfgang Kunz, et al., "Recursive Learning: A new Implication Technique for Efficient Solutions to CAD-problems: Test, Verification and Optimization", IEEE Trans. on Computer-Aided Design, vol. 13, No. 9, Sep. 1994, pp. 1143-1158.

Dhiraj K. Pradhan, et al. Verilat: Verification Using Logic Augmentation and Transformations, IEEE, ICCAD, 1996.

* cited by examiner

*Primary Examiner*—Phallaka Kik
(74) *Attorney, Agent, or Firm*—Blakely, Sokoloff, Taylor & Zafman LLP

(57) ABSTRACT

One embodiment of the present invention determines equivalence between a first circuit and a second circuit. The first circuit represented by a first circuit function is decomposed into first and second decomposition circuits represented by first and second decomposition functions, respectively. The first circuit has a plurality of first primary inputs and first primary outputs. The plurality of the first primary inputs includes first and second primary input subsets. A reducing function of a reducing circuit is selected for the first decomposition function to reduce complexity of a first composition of the first circuit function and the reducing function. Equivalence is determined between the first composition with a second composition of the reducing function and a second circuit function of a second circuit. The second circuit has a plurality of second primary inputs and second primary outputs matching to the plurality of the first primary inputs and the first primary outputs, respectively.

33 Claims, 9 Drawing Sheets

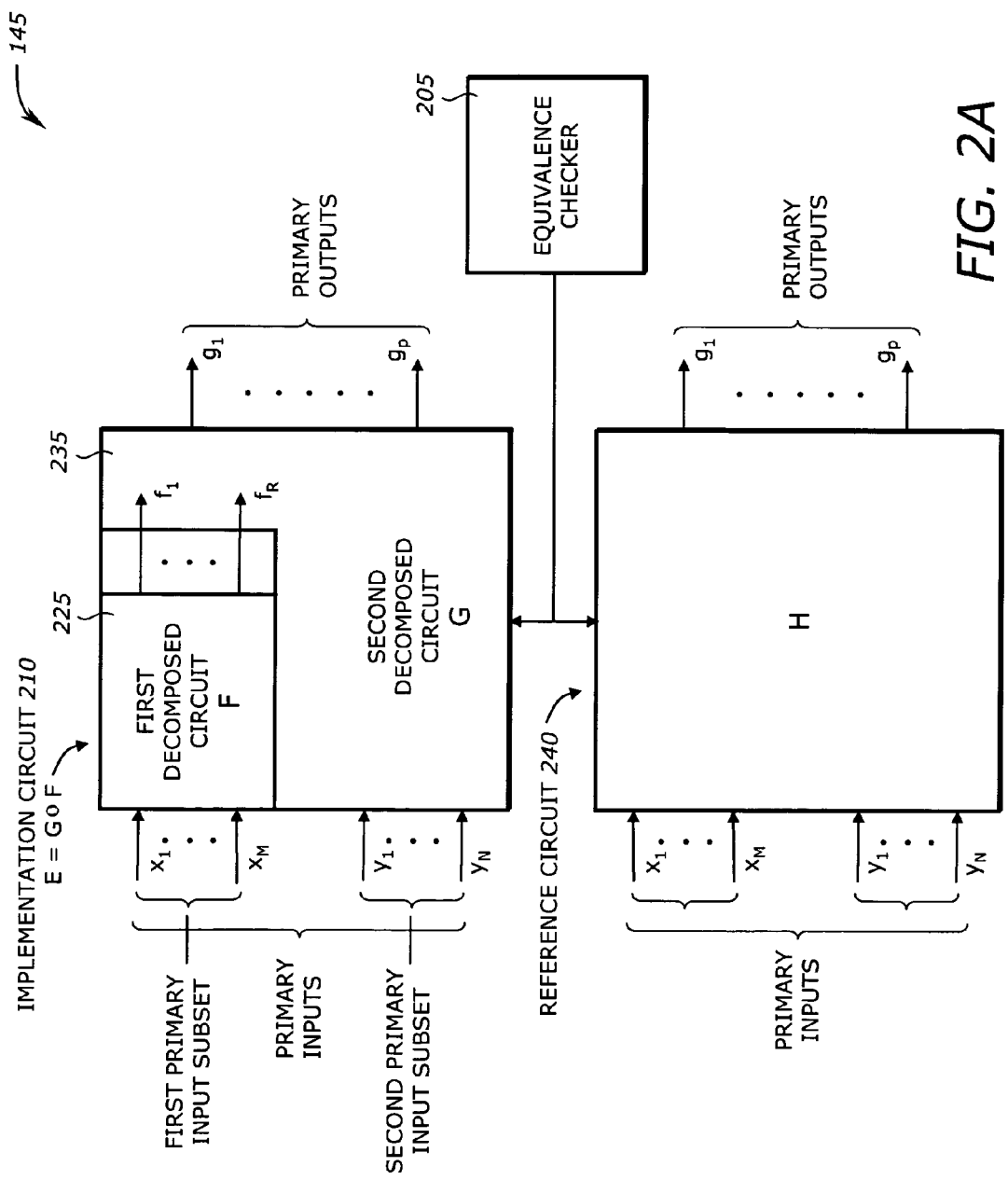

US 7,146,589 B1

REDUCING EQUIVALENCE CHECKING COMPLEXITY USING INVERSE FUNCTION

RELATED APPLICATIONS

This application is related to the following patent applications: Ser. No. 10/289,045 now U.S. Application Publication No. 2004/0088622, entitled "IMPROVING VERIFICATION OF DIGITAL CIRCUITRY USING RANGE GENERATORS" filed on Nov. 6, 2002 and assigned to the same assignee as the present application, the contents of which are herein incorporated by reference.

BACKGROUND

1. Field of the Invention

This invention relates to electronic design automation. In particular, the invention relates to equivalence checking.

2. Description of Related Art

Equivalence checking has become important in many design synthesis and optimization tools. In equivalence checking, an implementation circuit is compared with a reference circuit to determine if the two circuits are functionally equivalent. There are a number of techniques in equivalence checking: functional, automatic test pattern generation (ATPG), and incremental. Functional approaches use Binary Decision Diagrams (BDD's) to compare the two circuits. The circuits are equivalent if and only if their corresponding BDD's are isomorphic. ATPG approaches prove the equivalence of the two circuits under verification by proving that the stuck-at-0 is a redundant fault for their miter output. A variation of the ATPG is the Boolean Satisfiability (SAT) technique. Incremental approaches are based on reducing the miter circuit through the identification of internal equivalent pairs of the circuit nodes. Among these techniques, those using BDD's are popular.

The use of BDD's has a number of problems. First, if the circuit (or its subcircuits) are complex, their BDD's may become quite large, exceeding allocated storage and leading to high processing time. Second, false negatives may result with an intermediate cut or miter. A false negative is a problem in which the two circuits are equivalent but the equivalence checker or verifier declares them as different.

Therefore, there is a need to have an efficient technique to improve verification of digital circuits.

BRIEF DESCRIPTION OF THE DRAWINGS

The features and advantages of the present invention will become apparent from the following detailed description of the present invention in which:

FIG. 2A is a diagram illustrating an equivalence checking environment according to one embodiment of the invention.

DESCRIPTION

One embodiment of the present invention determines equivalence between a first circuit and a second circuit. The first circuit represented by a first circuit function is decomposed into first and second decomposition circuits represented by first and second decomposition functions, respectively. The first circuit has a plurality of first primary inputs and first primary outputs. The plurality of the first primary inputs includes first and second primary input subsets. The proof includes two subproofs. In the first subproof, a reducing function of a reducing circuit is selected for the first decomposition function to reduce complexity of a first composition of the first circuit function and the reducing function. Equivalence is determined between the first composition with a second composition of the reducing function and a second circuit function of a second circuit. The second circuit has a plurality of second primary inputs and second primary outputs matching to the plurality of the first primary inputs and the first primary outputs, respectively. A second subproof may be needed to conclude the equivalence of the first and second circuits. This second subproof includes (1) finding observability of all functions of the first decomposition on all primary outputs of the first circuit by sensitization on the specific inputs of the second decomposition, (2) evaluating an observability sequence in the first and second circuits, and (3) checking equivalence of both evaluations for all observability sequences.

In the following description, for purposes of explanation, numerous details are set forth in order to provide a thorough understanding of the present invention. However, it will be apparent to one skilled in the art that these specific details are not required in order to practice the present invention. In other instances, well-known electrical structures and circuits are shown in block diagram form in order not to obscure the present invention.

Figure 1:
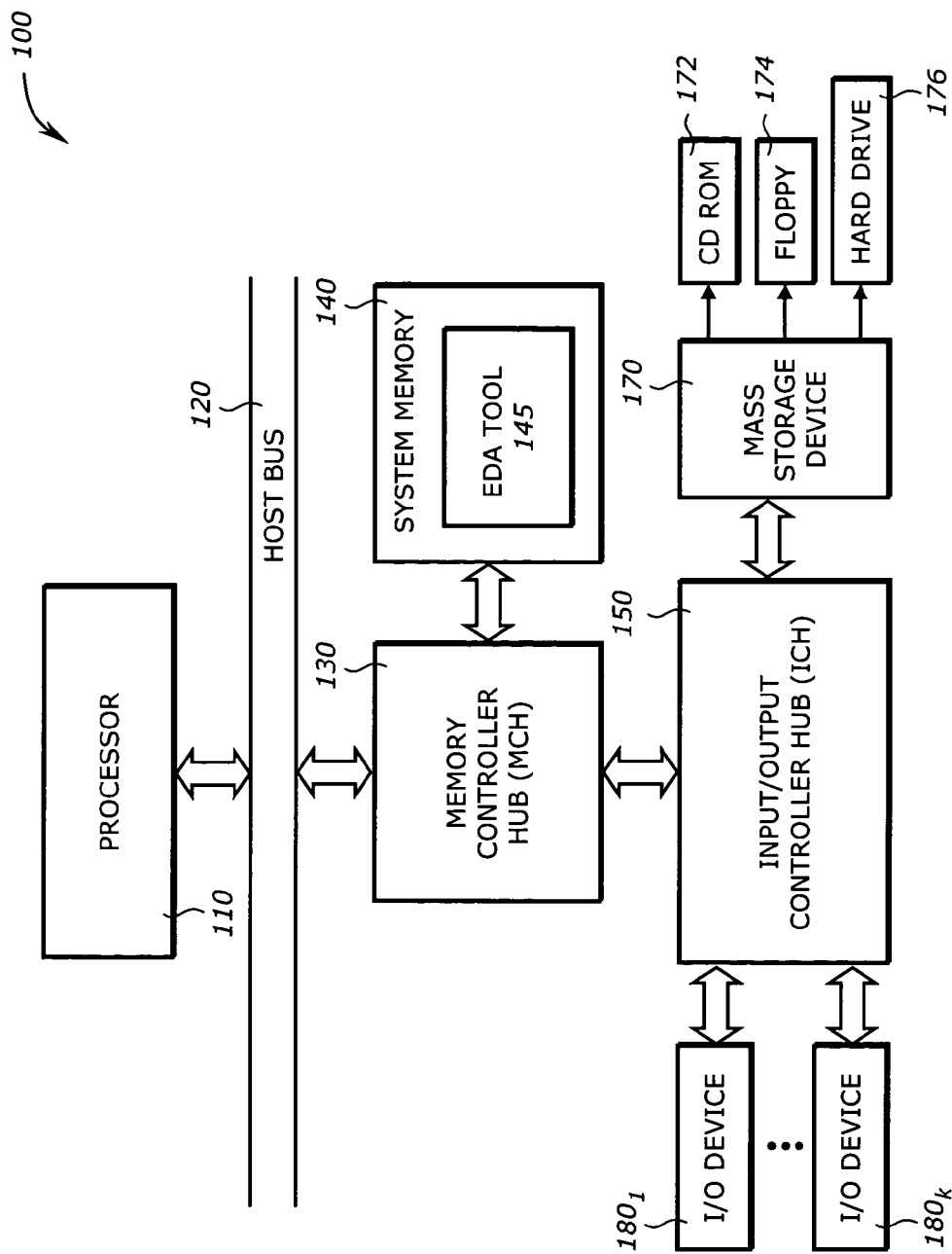
FIG. 1 is a diagram illustrating a system in which one embodiment of the invention can be practiced.

FIG. 1 is a diagram illustrating a computer system 100 in which one embodiment of the invention can be practiced. The computer system 100 includes a processor 110, a host bus 120, a memory control hub (MCH) 130, a system memory 140, an input/output control hub (ICH) 150, a mass storage device 170, and input/output devices $180_1$ to $180_K$.

The processor 110 represents a central processing unit of any type of architecture, such as embedded processors, micro-controllers, digital signal processors, superscalar computers, vector processors, single instruction multiple data (SIMD) computers, complex instruction set computers (CISC), reduced instruction set computers (RISC), very long instruction word (VLIW), or hybrid architecture. In one embodiment, the processor 110 is compatible with the Intel Architecture (IA) processor, such as the IA-32 and the IA-64. The host bus 120 provides interface signals to allow the processor 110 to communicate with other processors or devices, e.g., the MCH 130. The host bus 120 may support a uni-processor or multiprocessor configuration. The host bus 120 may be parallel, sequential, pipelined, asynchronous, synchronous, or any combination thereof.

The MCH 130 provides control and configuration of memory and input/output devices such as the system memory 140 and the ICH 150. The MCH 130 may be integrated into a chipset that integrates multiple functionalities such as the isolated execution mode, host-to-peripheral bus interface, memory control. For clarity, not all the peripheral buses are shown. It is contemplated that the system 100 may also include peripheral buses such as Peripheral Component Interconnect (PCI), accelerated graphics port (AGP), Industry Standard Architecture (ISA) bus, and Universal Serial Bus (USB), etc.

The system memory 140 stores system code and data. The system memory 140 is typically implemented with dynamic random access memory (DRAM) or static random access memory (SRAM). The system memory may include program code or code segments implementing one embodiment of the invention. The system memory includes an electronic design automation (EDA) tool 145. The EDA tool 145 may also be implemented by hardware, software, firmware, microcode, or any combination thereof. The EDA tool 145 may include a design synthesis tool, an equivalence checker, a circuit verifier, or any combination thereof. The system memory 140 may also include other programs or data which are not shown, such as an operating system.

The ICH 150 has a number of functionalities that are designed to support I/O functions. The ICH 150 may also be integrated into a chipset together or separate from the MCH 130 to perform I/O functions. The ICH 150 may include a number of interface and I/O functions such as PCI bus interface, processor interface, interrupt controller, direct memory access (DMA) controller, power management logic, timer, universal serial bus (USB) interface, mass storage interface, low pin count (LPC) interface, etc.

The mass storage device 170 stores archive information such as code, programs, files, data, applications, and operating systems. The mass storage device 170 may include compact disk (CD) ROM 172, floppy diskettes 174, and hard drive 176, and any other magnetic or optic storage devices. The mass storage device 170 provides a mechanism to read machine-readable media.

The I/O devices $180_1$ to $180_K$ may include any I/O devices to perform I/O functions. Examples of I/O devices $180_1$ to $180_K$ include controller for input devices (e.g., keyboard, mouse, trackball, pointing device), media card (e.g., audio, video, graphics), network card, and any other peripheral controllers.

The present invention may be implemented by hardware, software, firmware, microcode, or any combination thereof. When implemented in software, firmware, or microcode, the elements of the present invention are the program code or code segments to perform the necessary tasks. A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc. The program or code segments may be stored in a processor readable medium or transmitted by a computer data signal embodied in a carrier wave, or a signal modulated by a carrier, over a transmission medium. The "processor readable medium" may include any medium that can store or transfer information. Examples of the processor readable medium include an electronic circuit, a semiconductor memory device, a ROM, a flash memory, an erasable ROM (EROM), a floppy diskette, a compact disk CD-ROM, an optical disk, a hard disk, a fiber optic medium, a radio frequency (RF) link, etc. The computer data signal may include any signal that can propagate over a transmission medium such as electronic network channels, optical fibers, air, electromagnetic, RF links, etc. The code segments may be downloaded via computer networks such as the Internet, Intranet, etc.

It is noted that the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

FIG. 2A is a diagram illustrating an equivalence checking environment according to one embodiment of the invention. The equivalence checking environment is part of the EDA tool 145 and includes an equivalence checker 205, an implementation circuit 210, and a reference circuit 240.

The equivalence checker 205 checks for equivalence of circuits. The equivalence checker 205 compares the reference (REF) circuit 240 to the implementation (IMP) circuit 210 with corresponding primary inputs and outputs to determine if the IMP circuit 210 is valid for the reference. This is performed by determining if the function of each out put of the IMP circuit 210 is equivalent to the function of the corresponding output of the REF circuit 240. Typically, the corresponding inputs in REF and IMP circuits are associated with the same variables. There are many techniques to do equivalence checking. One technique uses functional equivalence. In this technique, representation diagrams such as the Binary Decision Diagram (BDD) is used to represent the REF and IMP networks or circuits 210 and 204. The two circuits are equivalent if their BDD's are equivalent. Note that two circuits are equivalent if the IMP circuit 210 is at least a valid implementation of the REF circuit 240. This includes a strict equivalence and a specific implementation of an incompletely specified circuit. For example, the REF circuit 240 may have some don't care variable and the IMP circuit 210 may assign logical 0 or 1 to these don't care variables.

The IMP and REF circuits 210 and 240 have primary inputs including first and second primary input subsets $(x_1, \ldots, x_M)$ and $(y_1, \ldots, y_N)$ and primary outputs $(g_1, \ldots, g_P)$ that are matched respectively. It is noted that full matching is not required. An incomplete matching may be possible to prove equivalence of the inputs or outputs are redundant. The IMP and REF circuits 210 and 240 may be parts of larger circuits.

The IMP circuit 210 has a circuit function E which characterizes the circuit and represents the relationship between the primary inputs and primary outputs. The IMP circuit 210 is decomposed into a first decomposition circuit 225 and a second decomposition circuit 235. The first and second decomposition circuits 225 and 235 are represented by first and second decomposition functions F and G, respectively. The first decomposition function F has a first input set corresponding to the first primary input subset $(x_1, \ldots, x_M)$ and a first output set $(f_1, \ldots, f_R)$. The second decomposition function G has a second input set corresponding to the second primary input subset $(y_1, \ldots, y_N)$ and the first output set $(f_1, \ldots, f_R)$, and a second output set corresponding to the primary outputs $(g_1, \ldots, g_P)$. Under this arrangement, the circuit function E can be considered as a composition of the first decomposition function E and the second decomposition function G. Or:

$$1. \ E = G \circ F \tag{1}$$

where o denotes a composition operator.

Note that although the IMP circuit 210 is decomposed and the REF circuit 240 is not, it is equally applicable to decompose the REF circuit 240. To prove equivalence, it is immaterial which circuit is decomposed.

Figure 2B:
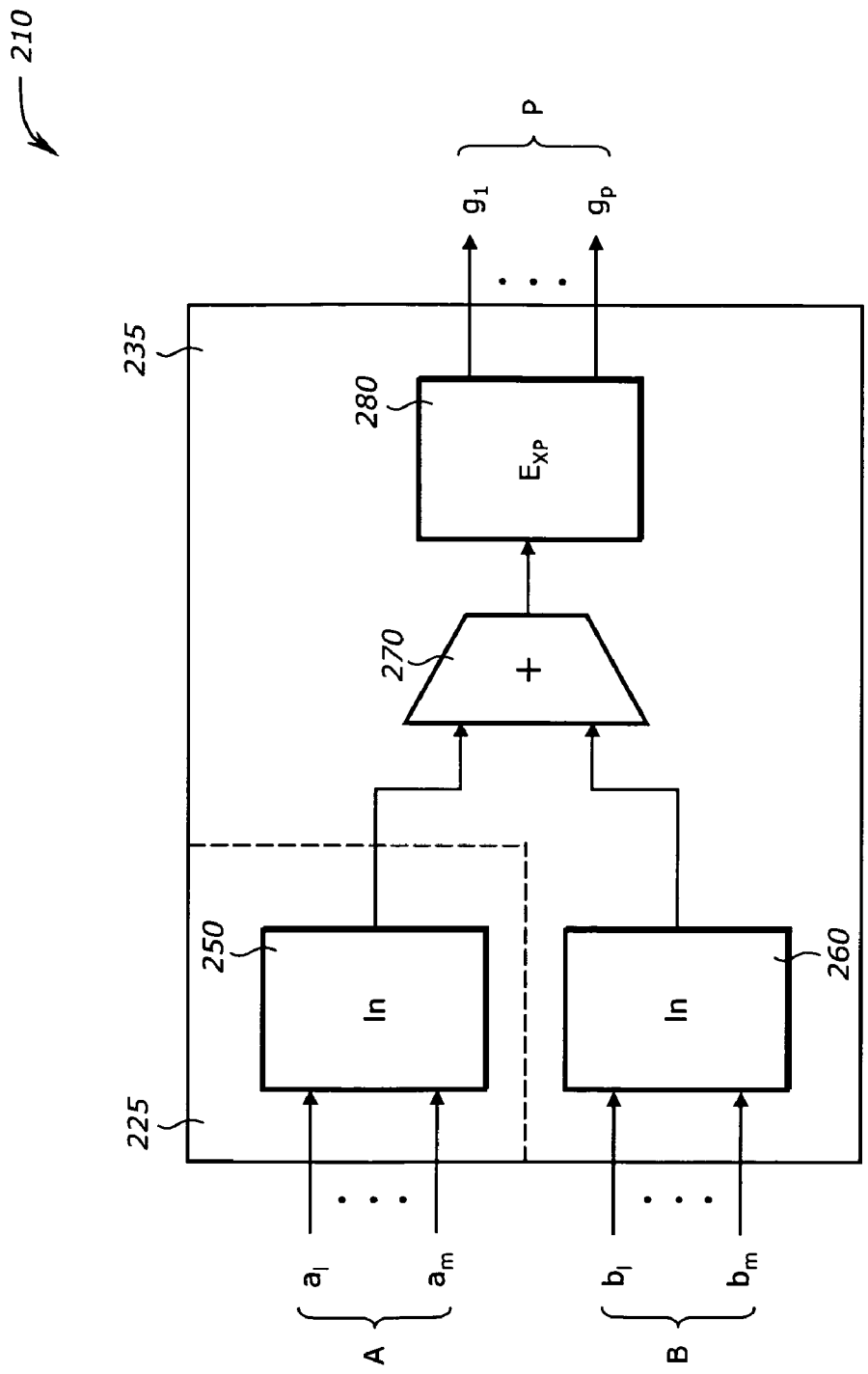
FIG. 2B is a diagram illustrating a decomposition of a multiplier circuit according to one embodiment of the invention.

FIG. 2B is a diagram illustrating a decomposition of a multiplier circuit 210 according to one embodiment of the invention. The multiplier circuit 210 includes a first decomposition circuit 225 and a second decomposition circuit 235.

The multiplier circuit 210 computes the product P of the two inputs A and B. The input A has M bits $a_1, \ldots, a_M$, and the input B has M bits $b_1, \ldots, b_M$. The product P has 2M bits $g_1, \ldots, g_{2M}$. The inputs $(a_1, \ldots, a_M)$ and $(b_1, \ldots, b_M)$ correspond to the first primary input subset $(x_1, \ldots, x_M)$ and the second primary input subset $(y_1, \ldots, y_N)$, respectively, as shown in FIG. 2A.

It is known that P=ab can be computed by taking the exponent of logarithm of P as follows:

$$P = \exp(\ln P) = \exp\{\ln(a) + \ln(b)\} \tag{2}$$

The logarithmic operators 250 and 260 determines the logarithms of a and b. The adder 270 adds the two logarithms together and the exponent operator 280 returns the value of P at the primary outputs. Note that this description is for illustrative purposes only. Special circuits or designs may be needed to handle special cases such as when a or b is equal to zero.

In this example, the multiplier circuit 210 is decomposed into the first decomposed circuit 225 and the second decomposed circuit 235. The first decomposed circuit 225 includes the logarithmic operator 250. The second decomposed circuit 235 includes the logarithmic operator 260, the adder 270 and the exponent operator 280.

Figure 3:
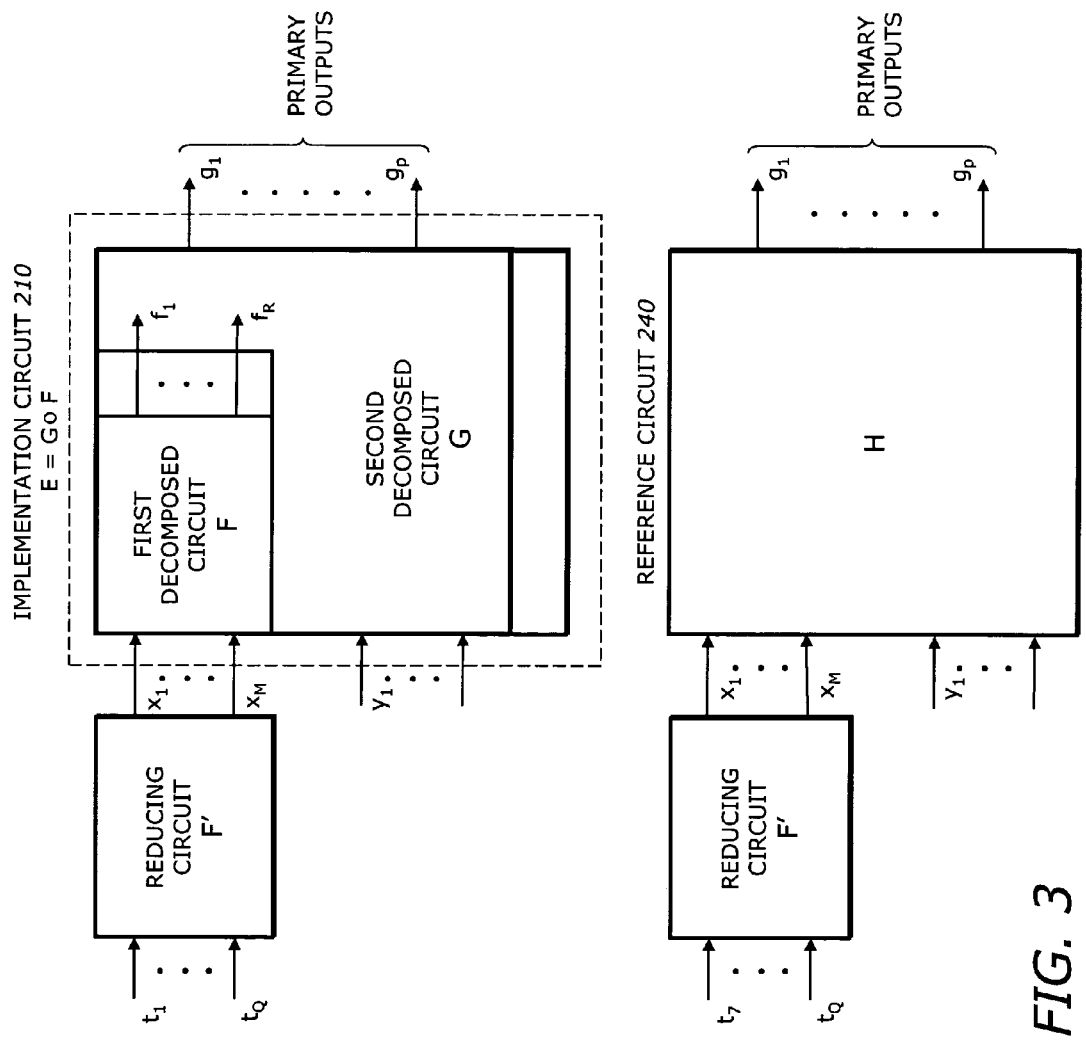
FIG. 3 is a diagram illustrating applying a reducing circuit to the implementation and reference circuits according to one embodiment of the present invention.

FIG. 3 is a diagram illustrating applying a reducing circuit to the implementation and reference circuits according to one embodiment of the present invention.

The equivalence checker 205 generates a reduce circuit having a reducing function F' to be applied to the decomposition function F. F' is selected to reduce complexity of a composition C1 of the first circuit function E=G o F and the reducing function F'. In other words, the composition C1 is:

$$C1 = E \circ F' = G \circ F \circ F' \tag{3}$$

where o denotes a composition operator.

In addition, F' is also selected such that the range of the composition F o F' is the same as the range of F.

In one embodiment, F' is an extended inverse function of F, or F'=E $\{F^{-1}\}$ where E{ } stands for extended. A composition of a function with its inverse returns an identity. The identity is the simplest form and therefore selecting the reducing function as an inverse function of F is desirable. An extended inverse function is an inverse function with additional inputs as will be explained in the following. However, as is known by one skilled in the art, functions other than the extended inverse function may be used. If F' is the extended inverse function of F, then the composition C1 in equation (3) above is reduced to G.

In particular, if all combinations of values of the output vector $(f_1, \ldots, f_R)$ are reachable, i.e., there are $2^R$ values and the number of input variables of F is equal to the number of outputs, i.e., M=R, then F is invertible. In this case, F is a bijection. The range of $F^{-1}$ is full for a bijection. F is usually invertible even if M is not equal to R. For example, F=(x&y, x|y), where & and | denote logical AND and OR operations, respectively, is invertible even though the output (f1=x&y=1, f0=x|y=0) does not exist. The inverse function $F^{-1}$ is (f1,f0) or (f1&f0,f0). It is also noted that $F^{-1}$ does not have to have the same number of inputs as the number of outputs of F.

Let I(u) be the function that produces $\{y_1, \ldots, y_N\}$ Let v be the input vector $\{t_1, \ldots, t_O\}$. Let R $\{f\}$ be the range of f. In essence, the proof that G(F) $\Leftrightarrow$ H may be converted into a 2-step process: (1) G(y,v)=H(y,$F^{-1}$(v)), and (2) G(I(u),F(y)) $\Leftrightarrow$ H(I(u),y), where given any alternative function F'(y): G(x,F(y))≠G(x,F'(y)) for some x,y implies G(I(u),F(y))≠G(I(u), F'(y)) for some u. The only way that the functions G and H are not equivalent is that y is not in the range of I(u) and x is not in the range of $F^{-1}$(v). In other words:

$$\text{G is not equivalent to H} \Leftrightarrow [\text{y is not in R}\{I(u)\}] \\ \text{AND } [\text{x is not in R}\{F^{-1}(v)\}] \tag{4}$$

Taking the complement of both sides:

$$\text{G is equivalent to H} \Leftrightarrow [\text{y in R}\{I(u)\}] \text{ OR } [\text{x is in R}\{F^{-1}(v)\}] \tag{5}$$

In other words, equivalence between G and H can be proved if x is proved to be in the range of $F^{-1}$(v) and y is proved to be in the range of I(u). Another way to say this is to invalidate one of the two assumptions that either y is not in the range of I(u) or that x is not in the range of $F^{-1}$(v). The simplest approach is to prove that x is in the range of $F^{-1}$(v). One way to do so is to extend the range of $F^{-1}$ so that all x values are in its range. The extended inverse function is the inverse function $F^{-1}$ with additional inputs that are used to fill out the range.

One construction of the extended inverse function F'=E$\{F^{-1}\}$ has two sets of inputs a and b. The first set of input a gives the desired output of v=F[E{F-1(a,b)}]. The second set of inputs b would allow the selection between the members of the equivalence class defined by v such that a=F(v). The extended inverse function E{F-1} has the same reducing properties for F' as a normal inverse function because a==F[E{F-1(a,b)}] so all the extra b variables are dropped out of the calculations.

The use of the extended inverse function is merely one way to determine equivalence. Another possible approach is to use the inverse function and perform a case analysis including a simulation of the missing patterns for the range. The use of the extended inverse function, therefore, replaces the use of a non-extended inverse function combined with an additional case analysis phase.

There is also a special case where the G function does not have the y input variables. In other words, all input variables of G are the output variables of F'. In this special case, the condition that y is in R$\{I(u)\}$ is automatically satisfied in equation (5). Therefore, an extended inverse function is not needed and F' can be just the inverse function $F^{-1}$.

For a number of Fi functions, they generate a range of values for the output vector $(f_1, \ldots, f_R)$ for the decomposition circuit F. $F^1$ can be determined or easily constructed such that F'=E$\{F^{-1}\}$ on the range of F even if F is not injective. It is only necessary to select any single vector $(f_1, \ldots, f_R)$ in the pre-image of F.

Although not necessary, the choice of the extended inverse function offers a number of advantages for checking equivalence between the IMP circuit 210 and the REF circuit 240. The technique in the present invention first proves equivalence between the composition G o F o F' and H o F'. Since G o F o F' has a reduced complexity, especially when F' is the inverse function of F, the proof of equivalence is simplified. Any technique can be used to prove equivalence, including comparing the BDD's.

If the composition G o F o F' is proved to be different than H o F', then it can be concluded that G o F is different than H and the two circuits are not equivalent. This conclusion is independent of the form of F'. This comes from the trivial contraposition of the following expression:

$$G \; o(F(x), y) \neq H(x,y) \rightarrow G \; o(F \; o \; F', y) \neq H \; o(F', y) \quad (6)$$

However, when the composition G o F o F' is proved equivalent to H, then having $F'=F^{-1}$ on the range of F has some advantages. If G o F o F' is equivalent to H, it is not sufficient to conclude that the two circuits are equivalent. This is because the range of F' may not be full, i.e., not all $2^M$ values are reachable. Since range of F' may not be full, some patterns on the inputs of F (or the outputs of F') may not have been considered, resulting in false positive errors. However, the potential errors come from the F block and not from the G block. These potential errors may also belong to the complement of range which may be helpful for subsequent processing. Therefore, a second step would be needed to conclude the equivalence by analyzing the correctness of F. However, if the range of F' is full, then it is sufficient to conclude that the two circuits are equivalent without further analyzing the correctness of F. This is because all the patterns on the inputs of G o F have been analyzed.

In general, F' may not have a full range. It is possible to construct or select F' such that it has a full range as illustrated in an example shown in FIG. 4. However, the technique in the present invention does not require F' to have a full range. If F' does not have a full range, a second step is needed to determine the correctness of F. If F is proved correct for all observable functions of F as sensitized on the G outputs, then equivalence can be declared. If F is proved not correct for any single case, then it is sufficient to conclude that there is no equivalence between the two circuits.

Figure 5:
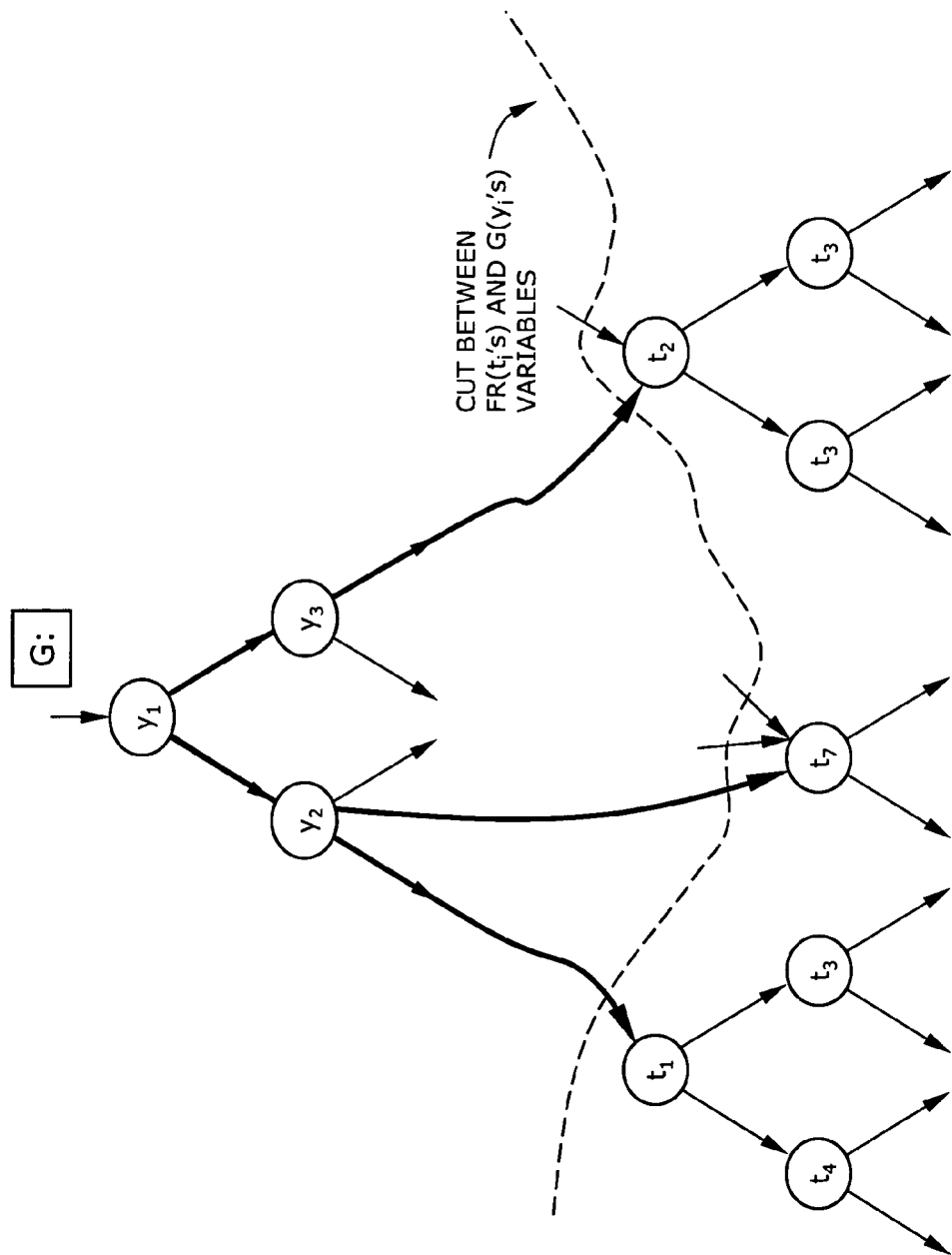
FIG. 5 is a diagram illustrating use of a Binary Decision Diagram for sensitization of a sub-function according to one embodiment of the invention.

To determine whether F is correct, the primary inputs of G other than the F inputs are examined, assigning them static logic values, such that all observable functions of F are sensitized on the G outputs by using either ATPG or BDD techniques There are at least two techniques to do this. The first technique is simple and fast but requires that all subfunctions of F ($f_1, \ldots, f_r$) can be sensitized independently from each other until G outputs. This means that none of them interacts or correlates with the logic of any other subfunctions. When this condition holds, a sensitization can be eventually found by structural analysis or ATPG techniques which are not subject to constraints and limitations (e.g. size explosion) as in BDD technique. There is also no need to use a range generator to simplify the F range in terms of BDD representation. The second technique is general and can be applied for the remaining $f_i$'s and their associated inputs $x_j$'s. This second technique uses BDD and implies the use of a range generator of F or R(F), which is simpler than F in size, to be applied on G input or the $x_j$'s. The calculation of G(R(F)) as BDDs is possible with respect to complexity. As a result, G is simplified in G o F ($y_1=0/1, \ldots, y_N=0/1$) and H is also simplified because the static values of $y_i$'s are used to simplify the logic of H. For each set of static values that reduces complexity of G, the simplified H is compared with the corresponding sub-function of F. If all sub-functions of F are proved correct to each simplified H, then all F functions are correct in H. Any incorrectness of any single sub-function of F leads to incorrectness of G o F through F. FIG. 5 shows using BDD to sensitize a F sub-function on G outputs. It should also be noted that a combination of the first and second techniques is possible and potentially leads to better results. Any combination implies that the second technique does not calculate the range generator of F, but a subrange of F.

Figure 4:
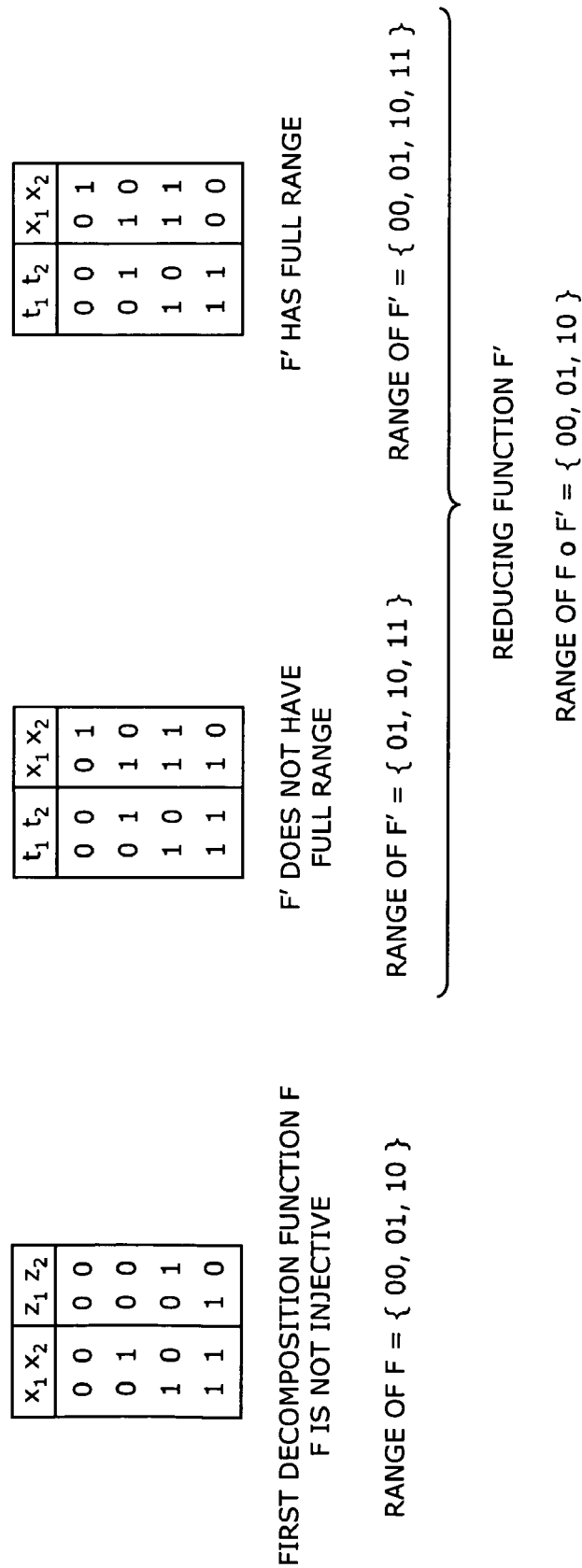
FIG. 4 is a diagram illustrating truth tables of a decomposition function and the associated reducing function according to one embodiment of the present invention.

FIG. 4 is a diagram illustrating truth tables of a decomposition function and the associated reducing function according to one embodiment of the present invention. There are three truth tables 410, 420, and 430

The truth table 410 describes the decomposition function F. As seen from this truth table, F is not infective and the range of F is {00, 01, and 10}.

The truth table 420 describes a potential, or candidate, reducing function F' which does not have a full range. The range of F' for the truth table 420 is {01, 10, 11}. Note that 00 is missing. The truth table 430 describes another potential, or candidate, reducing function F' which has a full range. The range of F' for the truth table 430 is {00, 01, 10, 11}. Both truth tables 420 and 430 correspond to reducing function F' that meets the requirement that the range of F o F' is the same as the range of F.

FIG. 5 is a diagram illustrating use of a Binary Decision Diagram for sensitization of a sub-function according to one embodiment of the invention. This technique is the general technique that covers the correlation problem between the $f_i$'s as discussed above.

The decomposition function F can be replaced by a range generator FR. The range generator FR is a function that is simpler than the decomposition function F, especially in terms of BDD representation, but provides exactly the same set of reachable output values.

The BDD is created by re-ordering the yi and xi inputs of G o FR in G o FR so that the $y_i$ variables>> the $x_i$ variables. By considering all cuts between $y_i$ and $x_i$ nodes in the BDD representation of the G outputs, one and only one is selected to each cut point to assign the $y_i$ variables. This provides a single static assignment on $y_i$ variables for each sub-function of FR so that it sensitizes this FR sub-function on G outputs. Note that the subfunction of FR defines the range of FR as function of $X_i$'s in the BDD. By proving equivalence between G o FR and H restricted to every set of $y_i$ assignments, it is concluded that FR is correct.

Figure 6:
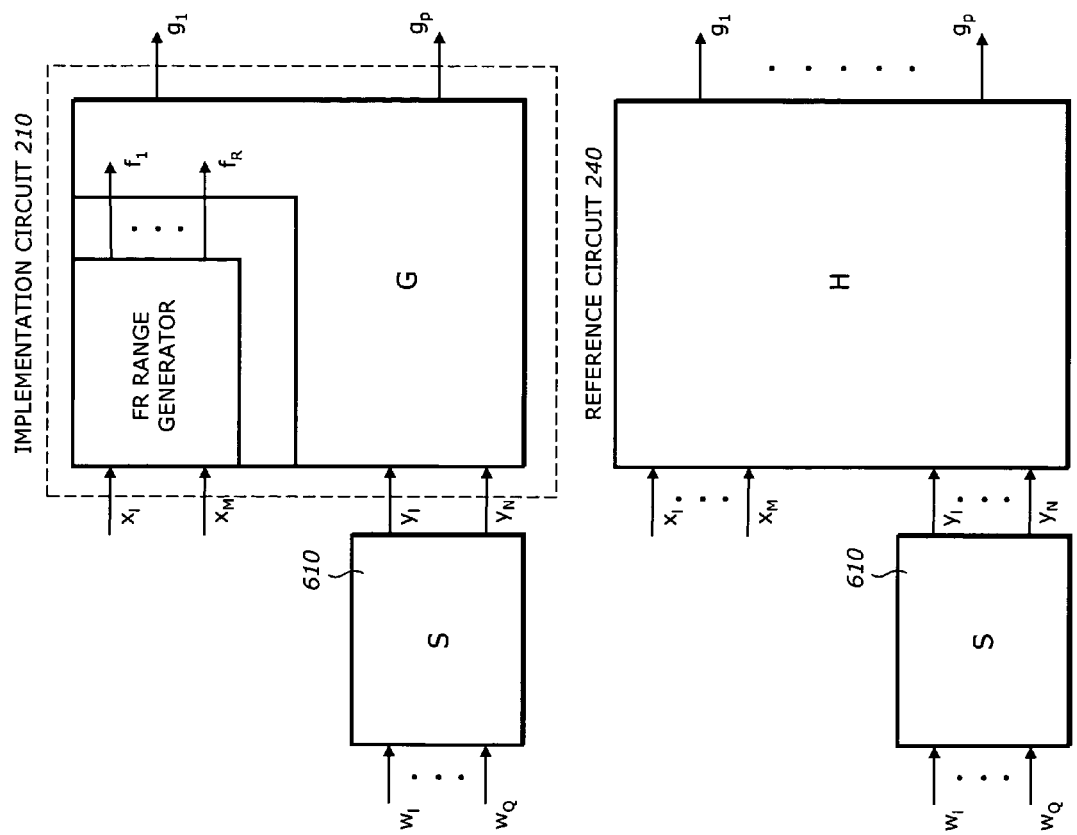
FIG. 6 is a diagram illustrating a sub-function sensitization according to one embodiment of the present invention.

FIG. 6 is a diagram illustrating a sub-function sensitization according to one embodiment of the present invention. The IMP circuit 210 includes the range generator FR in place of the decomposition function F. More generally, the inputs on (y) can be a function S(w) 610. The function S(w) 610 can be an inverse function as described above.

Figure 7:
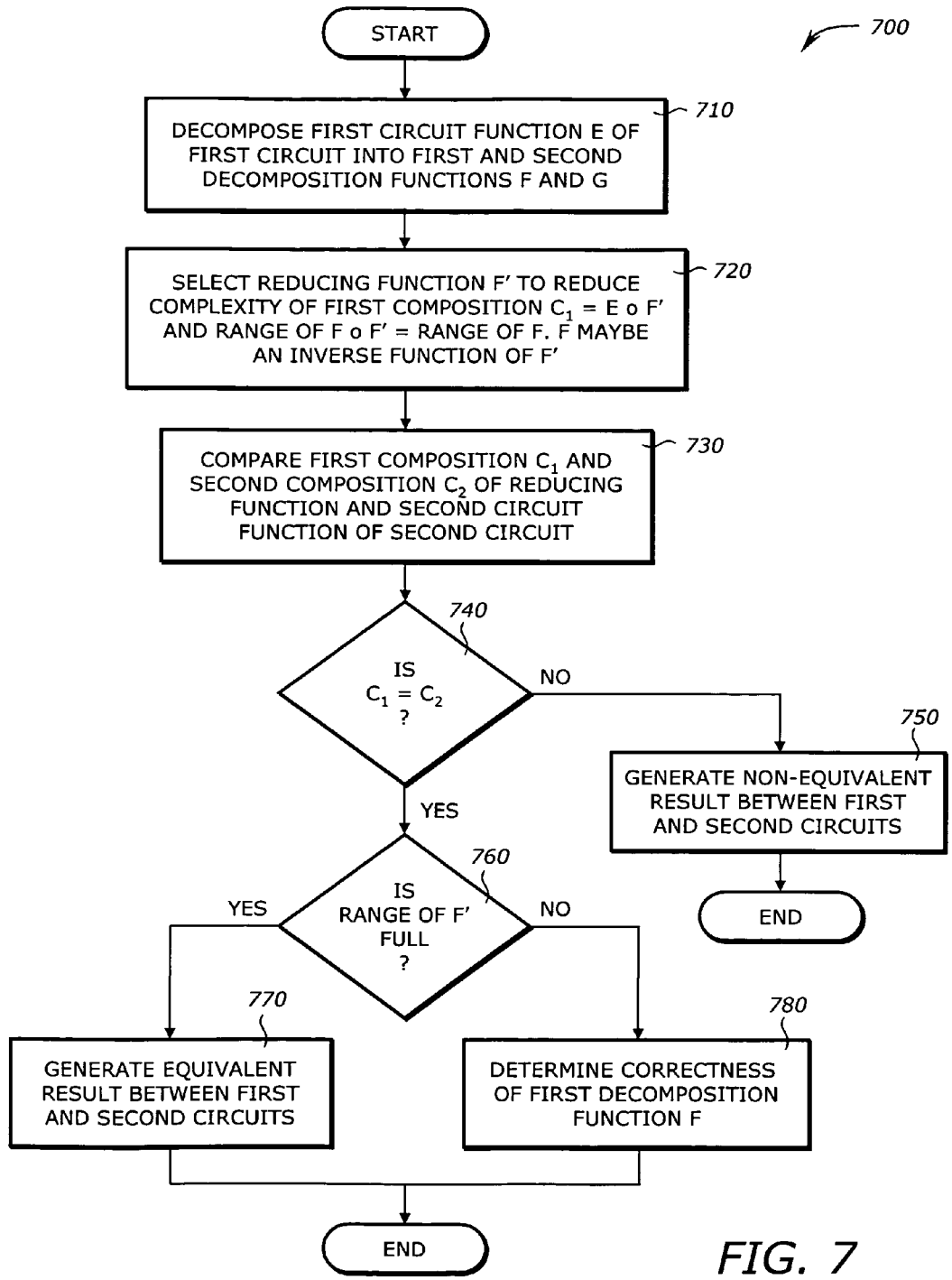
FIG. 7 is a flowchart illustrating a process to perform equivalence checking according to one embodiment of the present invention.

FIG. 7 is a flowchart illustrating a process 700 to perform equivalence checking according to one embodiment of the present invention.

Upon START, the process 700 decomposes a first circuit function E of a first circuit into the first and second decomposition functions F and G (Block 710). The inputs of the first decomposition function F correspond to a first subset of the primary inputs. The inputs of the second decomposition function G correspond to a second subset of the primary inputs of the first circuit and the outputs of F. Then, the process 700 selects or determines a reducing function F' to reduce the complexity of the first composition C1=E o F' (Block 720). F' is selected such that the range of F o F' is the same as the range of F. In one embodiment, F' is selected as an inverse function or an extended inverse function of F.

Next, the process 700 determines the equivalence between the first circuit and a second circuit. This is performed by first comparing the composition C1 and a composition C2=F' o H where H is the circuit function of the second circuit (Block 730). Then, the process 700 determines if C1 is equal to C2 (Block 740). This determination can be done by any suitable or convenient method, including comparing the BDD's associated with C1 and C2.

If C1 is not equal to C2, then the process 700 generates a non-equivalent result between the first and second circuits (Block 750). In other words, the process 700 declares that the first and second circuits are not equivalent. The process 700 is then terminated. If C1 is equal to C2, the process 700 determines if the range of the reducing function F' is full or not (Block 760). If the range of F' is full, the process 700 generates an equivalent result between the first and second circuits (Block 770). In other words, the process 700 declares that the first and second circuits are equivalent. The process 700 is then terminated. If the range of F' is not full, the process 700 determines the correctness of the decomposition function F (Block 780). The details of Block 780 are described in FIG. 8. The process 700 is then terminated.

Figure 8:
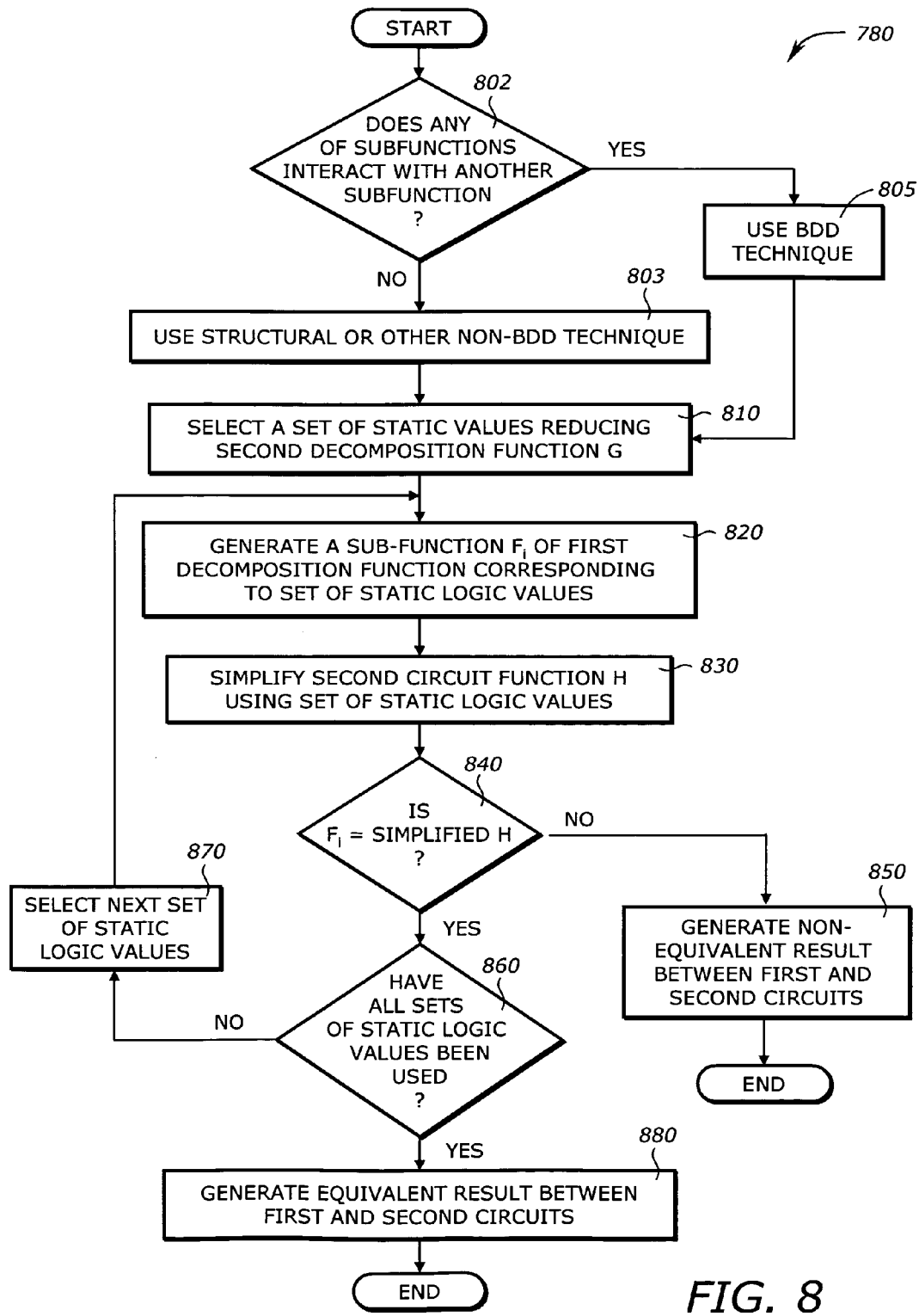
FIG. 8 is a flowchart illustrating a process to determine the correctness of the decomposition function F according to one embodiment of the present invention.

FIG. 8 is a flowchart illustrating a process 780 to determine the correctness of the decomposition function F according to one embodiment of the present invention.

Upon START, the process 780 determines if any of the subfunctions ($f_1 \ldots f_R$) interact with any other subfunctions (Block 802). If not, the process 780 uses the structural or any non-BDD technique (Block 803). Otherwise, the process 780 uses the BDD technique (Block 805). Then the process 780 selects a set of static logic values that reduce the complexity of the second decomposition function G (Block 810). Next, the process 780 generates a sub-function Fi of the first decomposition function F that corresponds to the set of the static logic values (Block 820). Then, the process 780 simplifies the second circuit function H using the set of static logic values (Block 830).

Next, the process 780 determines if the sub-function Fi is equal to the simplified H (Block 840). If not, the process 700 generates a non-equivalent result between the first and second circuits (Block 850). In other words, the process 780 declares that the first and second circuits are not equivalent. The process 780 is then terminated. If the sub-function Fi is equal to the simplified H, the process 780 determines if all the sets of static logic values have been used (Block 860). If not, the process 780 selects the next set of static logic values that reduces G (Block 870) and goes back to Block 820. Otherwise, the process 780 generates an equivalent result between the first and second circuits (Block 880). In other words, the process 780 declares that the first and second circuits are equivalent. The process 780 is then terminated.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. A method comprising:
    decomposing a first circuit represented by a first circuit function into first and second decomposition circuits represented by first and second decomposition functions, respectively, the first circuit having a plurality of first primary inputs and first primary outputs, the plurality of the first primary inputs including first and second primary input subsets;
    selecting a reducing function of a reducing circuit for the first decomposition function to reduce complexity of a first composition of the first circuit function and the reducing function; and
    determining equivalence between the first composition with a second composition of the reducing function and a second circuit function of a second circuit, the second circuit having a plurality of second primary inputs and second primary outputs matching to the plurality of the first primary inputs and the first primary outputs, respectively.

2. The method of claim 1 wherein decomposing comprises:
    determining the first decomposition function having a first input set corresponding to the first primary input subset and a first output set; and
    determining the second decomposition function having a second input set corresponding to the second primary input subset and the first output set, and a second output set corresponding to the first primary outputs.

3. The method of claim 1 wherein selecting the reducing function comprises:
    selecting the reducing function having range equal to range of a composition of the first decomposition function and the reducing function.

4. The method of claim 3 wherein selecting the reducing function further comprises:
    selecting one of an inverse function and an extended inverse function of the first decomposition function.

5. The method of claim 4 wherein selecting one of the inverse function and the extended inverse function comprises:
    providing an additional set of inputs corresponding to members of an equivalence class.

6. The method of claim 1 wherein determining the equivalence comprises:
    comparing the first composition and the second composition; and
    determining correctness of the first decomposition function if the first composition is equivalent to the second composition.

7. The method of claim 6 wherein determining the equivalence further comprises:
    generating a non-equivalent result between the first and second circuits if the first composition is not equivalent to the second composition.

8. The method of claim 6 wherein determining the equivalence further comprises:
    generating an equivalent result between the first and second circuits if the first composition is equivalent to the second composition and range of the reducing function is full.

9. The method of claim 6 wherein determining the correctness of the first decomposition function comprises:
    selecting a set of static logic values reducing the second decomposition function;
    generating a sub-function of the first decomposition function corresponding to the set of static logic values;
    simplifying the second circuit function using the set of static logic values; and
    comparing the sub-function with the simplified second circuit function.

10. The method of claim 9 wherein determining the equivalence further comprises:

generating a non-equivalent result between the first and second circuits if the sub-function is not equivalent to the simplified second circuit function.

11. The method of claim 9 wherein determining the correctness further comprises:
using a non-binary decision diagram (BDD) technique if there is no interaction among sub-functions of the first decomposition function.

12. A computer program product comprising:
a machine useable medium having program code embedded therein, the program code comprising:
computer readable program code to decompose a first circuit represented by a first circuit function into first and second decomposition circuits represented by first and second decomposition functions, respectively, the first circuit having a plurality of first primary inputs and first primary outputs, the plurality of the first primary inputs including first and second primary input subsets;
computer readable program code to select a reducing function of a reducing circuit for the first decomposition function to reduce complexity of a first composition of the first circuit function and the reducing function; and
computer readable program code to determine equivalence between the first composition with a second composition of the reducing function and a second circuit function of a second circuit, the second circuit having a plurality of second primary inputs and second primary outputs matching to the plurality of the first primary inputs and the first primary outputs, respectively.

13. The computer program product of claim 12 wherein the computer readable program code to decompose comprises:
computer readable program code to determine the first decomposition function having a first input set corresponding to the first primary input subset and a first output set; and
computer readable program code to determine the second decomposition function having a second input set corresponding to the second primary input subset and the first output set, and a second output set corresponding to the first primary outputs.

14. The computer program product of claim 13 wherein the computer readable program code to determine the equivalence comprises:
computer readable program code to compare the first composition and the second composition; and
computer readable program code to determine correctness of the first decomposition function if the first composition is equivalent to the second composition.

15. The computer program product of claim 14 wherein the computer readable program code to determine the correctness of the first decomposition function comprises:
computer readable program code to select a set of static logic values reducing the second decomposition function;
computer readable program code to generate a sub-function of the first decomposition function corresponding to the set of static logic values;
computer readable program code to simplify the second circuit function using the set of static logic values; and
computer readable program code to compare the sub-function with the simplified second circuit function.

16. The computer program product of claim 15 wherein the computer readable program code to determine the equivalence further comprises:
computer readable program code to generate a non-equivalent result between the first and second circuits if the sub-function is not equivalent to the simplified second circuit function.

17. The computer program product of claim 15 wherein the computer readable program code to determine the correctness further comprises:
computer readable program code to use a non-binary decision diagram (BDD) technique if there is no interaction among sub-functions of the first decomposition function.

18. The computer program product of claim 12 wherein the computer readable program code to select the reducing function comprises:
computer readable program code to select the reducing function having range equal to range of a composition of the first decomposition function and the reducing function.

19. The computer program product of claim 18 wherein the computer readable program code to select the reducing function further comprises:
computer readable program code to select one of an inverse function and extended inverse function of the first decomposition function.

20. The computer program product of claim 19 wherein the computer readable program code to select one of the inverse function and the extended inverse function comprises:
computer readable program code to provide an additional set of inputs corresponding to members of an equivalence class.

21. The computer program product of claim 20 wherein the computer readable program code to determine the equivalence further comprises:
computer readable program code to generate a non-equivalent result between the first and second circuits if the first composition is not equivalent to the second composition.

22. The computer program product of claim 20 wherein the computer readable program code to determine the equivalence further comprises:
computer readable program code to generate an equivalent result between the first and second circuits if the first composition is equivalent to the second composition and range of the reducing function is full.

23. A system comprises:
a processor; and
a memory coupled to the processor having an electronic design automation (EDA) tool, the EDA tool, when executed, causes the processor to:
decompose a first circuit represented by a first circuit function into first and second decomposition circuits represented by first and second decomposition functions, respectively, the first circuit having a plurality of first primary inputs and first primary outputs, the plurality of the first primary inputs including first and second primary input subsets,
select a reducing function of a reducing circuit for the first decomposition function to reduce complexity of a first composition of the first circuit function and the reducing function, and
determine equivalence between the first composition with a second composition of the reducing function and a second circuit function of a second circuit, the second circuit having a plurality of second primary inputs and second primary outputs matching to the plurality of the first primary inputs and the first primary outputs, respectively.

24. The system of claim 23 wherein the EDA tool causing the processor to decompose causes the processor to:
determine the first decomposition function having a first input set corresponding to the first primary input subset and a first output set; and
determine the second decomposition function having a second input set corresponding to the second primary input subset and the first output set, and a second output set corresponding to the first primary outputs.

25. The system of claim 23 wherein the EDA tool causing the processor to select the reducing function causes the processor to:
select the reducing function having range equal to range of a composition of the first decomposition function and the reducing function.

26. The system of claim 25 wherein the EDA tool causing the processor to select the reducing function further causes the processor to:
select one of an inverse function and an extended inverse function of the first decomposition function.

27. The system of claim 26 wherein the EDA tool causing the processor to select one of an inverse function and an extended inverse function causes the processor to:
provide an additional set of inputs corresponding to members of an equivalence class.

28. The system of claim 23 wherein the EDA tool causing the processor to determine the equivalence causes the processor to:
compare the first composition and the second composition; and
determine correctness of the first decomposition function if the first composition is equivalent to the second composition.

29. The system of claim 28 wherein the EDA tool causing the processor to determine the equivalence further causes the processor to:
generate a non-equivalent result between the first and second circuits if the first composition is not equivalent to the second composition.

30. The system of claim 28 wherein the EDA tool causing the processor to determine the equivalence further causes the processor to:
generate an equivalent result between the first and second circuits if the first composition is equivalent to the second composition and range of the reducing function is full.

31. The system of claim 28 wherein the EDA tool causing the processor to determine the correctness of the first decomposition function causes the processor to:
select a set of static logic values reducing the second decomposition function;
generate a sub-function of the first decomposition function corresponding to the set of static logic values;
simplify the second circuit function using the set of static logic values; and
compare the sub-function with the simplified second circuit function.

32. The system of claim 31 wherein the EDA tool causing the processor to determine the equivalence further causes the processor to:
generate a non-equivalent result between the first and second circuits if the sub-function is not equivalent to the simplified second circuit function.

33. The system of claim 31 wherein the EDA tool causing the processor to determine the correctness further causes the processor to use a non-binary decision diagram (BDD) technique if there is no interaction among sub-functions of the first decomposition function.

* * * * *